(12) United States Patent
Xie et al.

(10) Patent No.: US 11,211,452 B1
(45) Date of Patent: Dec. 28, 2021

(54) TRANSISTOR HAVING STACKED SOURCE/DRAIN REGIONS WITH FORMATION ASSISTANCE REGIONS AND MULTI-REGION WRAP-AROUND SOURCE/DRAIN CONTACTS

(71) Applicant: International Business Machines Corporation, Armonk, NY (US)

(72) Inventors: Ruilong Xie, Niskayuna, NY (US); Reinaldo Vega, Mahopac, NY (US); Kangguo Cheng, Schenectady, NY (US); Chanro Park, Clifton Park, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/916,736

(22) Filed: Jun. 30, 2020

(51) Int. Cl.
  *H01L 29/417* (2006.01)
  *H01L 29/66* (2006.01)
  *H01L 29/786* (2006.01)
  *H01L 29/161* (2006.01)
  *H01L 29/06* (2006.01)
  *H01L 29/45* (2006.01)
  *H01L 29/08* (2006.01)
  *H01L 21/8234* (2006.01)

(52) U.S. Cl.
  CPC .. *H01L 29/0665* (2013.01); *H01L 21/823418* (2013.01); *H01L 21/823431* (2013.01); *H01L 29/41791* (2013.01); *H01L 29/6681* (2013.01)

(58) Field of Classification Search
  CPC ....... H01L 21/02603; H01L 21/823418; H01L 21/823431; H01L 21/823814; H01L 21/823821; H01L 21/845; H01L 27/0886; H01L 27/0924; H01L 27/10879; H01L 27/1211; H01L 29/0665; H01L 29/0669; H01L 29/0673; H01L 29/41791; H01L 29/66439; H01L 29/66795; H01L 29/6681; H01L 29/775; H01L 29/785; H01L 29/7851; H01L 29/7853; H01L 29/7855; H01L 2029/7858
  See application file for complete search history.

(56) References Cited

U.S. PATENT DOCUMENTS 8,183,587 B2 5/2012 Samuelson et al.
9,647,139 B2 * 5/2017 Doris ................ H01L 29/66742
(Continued)

OTHER PUBLICATIONS

Das et al., "Parasitic Capacitances on Scaling Lateral Nanowire," Nanowires-Synthesis, Properties and Applications, IntechOpen, 2019, 21 pages.
(Continued)

*Primary Examiner* — David C Spalla
(74) *Attorney, Agent, or Firm* — Cantor Colburn LLP; Randall Bluestone

(57) ABSTRACT

Embodiments of the invention are directed to a method of performing fabrication operations to form a transistor, wherein the fabrication operations include forming a source or drain (S/D) region having stacked, spaced-apart, and doped S/D layers. The fabrication operations further include forming a multi-region S/D contact structure configured to contact a top surface, a bottom surface, and sidewalls of each of the stacked, spaced-apart, and doped S/D layers.

19 Claims, 16 Drawing Sheets

(56) References Cited

U.S. PATENT DOCUMENTS

| | | | |
|---|---|---|---|
| 9,842,914 B1 | 12/2017 | Yeung et al. | |
| 9,847,390 B1 | 12/2017 | Xie et al. | |
| 9,953,979 B2 | 4/2018 | Xu et al. | |
| 10,263,149 B2 | 4/2019 | Samuelson et al. | |
| 10,276,442 B1 | 4/2019 | Xie et al. | |
| 10,483,385 B2 | 11/2019 | Cea et al. | |
| 10,971,584 B2 * | 4/2021 | Xu | H01L 29/6656 |
| 2018/0197965 A1 | 7/2018 | Adusumilli et al. | |
| 2018/0269305 A1 | 9/2018 | Bao et al. | |
| 2019/0326395 A1 * | 10/2019 | Ando | H01L 29/0673 |
| 2020/0091288 A1 * | 3/2020 | Lee | B82Y 10/00 |
| 2020/0312981 A1 * | 10/2020 | Bomberger | H01L 29/32 |
| 2020/0365692 A1 * | 11/2020 | Jung | H01L 29/0669 |
| 2021/0020745 A1 * | 1/2021 | Passlack | H01L 51/0558 |

OTHER PUBLICATIONS

Loubet et al., "Stacked Nanosheet Gate-All-Around Transistor to Enable Scaling Beyond FinFET", 2017 Symposium on VLSI Technology Digest of Technical Papers, pp. T230-T231.

\* cited by examiner

TRANSISTOR HAVING STACKED SOURCE/DRAIN REGIONS WITH FORMATION ASSISTANCE REGIONS AND MULTI-REGION WRAP-AROUND SOURCE/DRAIN CONTACTS

BACKGROUND

The present invention relates in general to fabrication methods and resulting structures for semiconductor devices. More specifically, the present invention relates to fabrication methods and resulting structures for transistors having stacked and spaced-apart source or drain (S/D) regions with formation assistance regions and multi-region wrap-around S/D contacts having stacked and spaced-apart S/D contact layers formed therein.

In contemporary semiconductor device fabrication processes, a large number of metal oxide semiconductor field effect transistors (MOSFETs), such as n-type field effect transistors (nFETs) and p-type field effect transistors (pFETs), are fabricated on a single wafer. Non-planar MOSFET architectures (e.g., fin-type FETs (FinFETs) and nanosheet FETs) can provide increased device density and increased performance over planar MOSFETs. For example, nanosheet FETs, in contrast to conventional planar MOSFETs, include a gate stack that wraps around the full perimeter of multiple stacked and spaced-apart nanosheet channel regions for a reduced device footprint and improved control of channel current flow.

During the first portion of chip-making (i.e., the front-end-of-line (FEOL) stage), the individual components (transistors, capacitors, etc.) are fabricated on the wafer. The middle-of-line (MOL) stage follows the FEOL stage and typically includes process flows for forming the contacts and other structures that communicatively couple to active regions (e.g., gate, source, and drain) of the device element. In the back-end-of-line (BEOL) stage, these device elements are connected to each other through a network of interconnect structures to distribute signals, as well as power and ground.

SUMMARY

Embodiments of the invention are directed to a method of performing fabrication operations to form a transistor, wherein the fabrication operations include forming a source or drain (S/D) region having stacked, spaced-apart, and doped S/D layers. The fabrication operations further include forming a multi-region S/D contact structure configured to contact a top surface, a bottom surface, and sidewalls of each of the stacked, spaced-apart, and doped S/D layers.

Embodiments of the invention are directed to a transistor that includes an S/D region having stacked, spaced-apart, and doped S/D layers. The transistor further includes a multi-region S/D contact structure configured to contact a top surface, a bottom surface, and sidewalls of each of the stacked, spaced-apart, and doped S/D layers.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-16 depict multiple cross-sectional views of a nanosheet-based structure after various fabrication operations for forming a transistor having stacked and spaced-apart source or drain (S/D) regions with formation assistance regions and multi-region wrap-around S/D contacts, in which:

FIG. 1 depicts cross-sectional views of the nanosheet-based structure after initial fabrication operations in accordance with aspects of the present invention;

FIG. 2 depicts cross-sectional views of the nanosheet-based structure after additional fabrication operations in accordance with aspects of the present invention;

FIG. 3 depicts cross-sectional views of the nanosheet-based structure after additional fabrication operations in accordance with aspects of the present invention;

FIG. 4 depicts cross-sectional views of the nanosheet-based structure after additional fabrication operations in accordance with aspects of the present invention;

FIG. 5 depicts cross-sectional views of the nanosheet-based structure after additional fabrication operations in accordance with aspects of the present invention;

FIG. 6 depicts cross-sectional views of the nanosheet-based structure after additional fabrication operations in accordance with aspects of the present invention;

FIG. 7 depicts cross-sectional views of the nanosheet-based structure after additional fabrication operations in accordance with aspects of the present invention;

FIG. 8 depicts cross-sectional views of the nanosheet-based structure after additional fabrication operations in accordance with aspects of the present invention; and FIG. 9 depicts cross-sectional views of the nanosheet-based structure after additional fabrication operations in accordance with aspects of the present invention;

FIG. 10 depicts cross-sectional views of the nanosheet-based structure after fabrication operations in accordance with aspects of the present invention;

FIG. 11 depicts cross-sectional views of the nanosheet-based structure after additional fabrication operations in accordance with aspects of the present invention;

FIG. 12 depicts cross-sectional views of the nanosheet-based structure after additional fabrication operations in accordance with aspects of the present invention;

FIG. 13 depicts cross-sectional views of the nanosheet-based structure after additional fabrication operations in accordance with aspects of the present invention;

FIG. 14 depicts cross-sectional views of the nanosheet-based structure after additional fabrication operations in accordance with aspects of the present invention;

FIG. 15 depicts cross-sectional views of the nanosheet-based structure after fabrication operations in accordance with aspects of the present invention; and FIG. 16 depicts cross-sectional views of the nanosheet-based structure after additional fabrication operations in accordance with aspects of the present invention.

DETAILED DESCRIPTION

Figure 1:
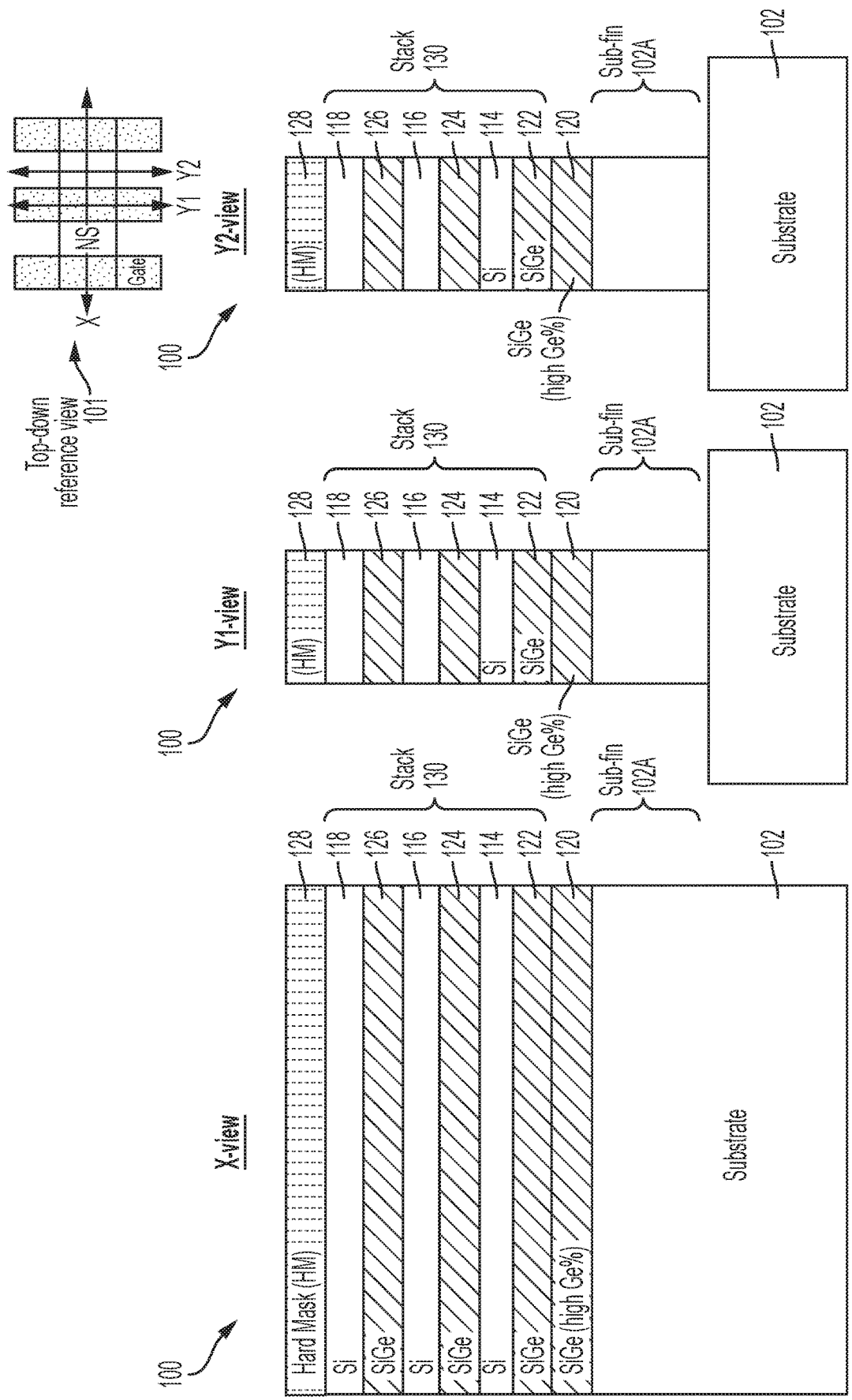

Although this detailed description includes examples of how aspects of the invention can be implemented to form a transistor having stacked and spaced-apart source or drain (S/D) regions with formation assistance regions and multi-region wrap-around S/D contacts, implementation of the teachings recited herein are not limited to a particular type of FET structure or combination of materials. Rather, embodiments of the present invention are capable of being implemented in conjunction with any other type of transistor device (planar, non-planar, p-FET, n-FET, fin-type FET) or material (e.g., Si or SiGe), now known or later developed, wherein it is desirable to provide stacked and spaced-apart S/D regions with formation assistance regions and multi-region wrap-around S/D contacts.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of thin nanosheets (e.g., about 3 nm to about 8 nm thick). In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, as the size of MOSFETs and other devices decreases, the dimensions of S/D regions, channel regions, and gate electrodes also decrease. Accordingly, with device size reductions, the contribution of middle-of-line (MOL) contact resistance to the total parasitic resistance is increasing in advanced CMOS devices. Thus, resistance at the interface between the S/D contacts and the S/D regions can be a major contributor to the total external parasitic resistance.

Turning now to an overview of aspects of the invention, embodiments of the invention address the above-described shortcomings in known S/D region fabrication processes by providing fabrication methods and resulting structures for forming transistors having stacked and spaced-apart S/D regions with formation assistance regions and multi-region wrap-around S/D contacts. In embodiments of the invention, each of the multi-region wrap-around S/D contacts includes stacked and spaced-apart S/D contact layers. A fabrication methodology in accordance with embodiments of the invention includes forming alternating layers of non-sacrificial nanosheets and sacrificial nanosheets then etching them into adjacent nanosheet stacks. End regions of the sacrificial nanosheets in the adjacent nanosheet stacks are replaced with inner spacers formed from dielectric material. The space between adjacent nanosheet stacks defines sidewall portions of an S/D trench in which an S/D region will be formed. In accordance with aspects of the invention, a formation assistance (or nucleation) region is formed in a portion of the transistor's substrate, and an exposed surface of the formation assistance region defines a bottom surface of the S/D trench.

In embodiments of the invention, a first sacrificial S/D contact layer is grown from a top surface of the formation assistance region, and a cyclic etch-back process is used to, in effect, suppress growth of the first sacrificial S/D contact layer from sidewalls of the non-sacrificial nanosheets. In embodiments of the invention, the cyclic etch-back process leverages different epitaxial growth rates that result from different crystal orientations in the semiconductor crystals that form the transistor. In general, the wafers in/on which transistors are formed are grown on crystals that have a regular crystal structures. When wafers are sliced from the crystal, the surface is aligned in one of several relative directions, known as the orientation or the growth plane of the crystalline silicon. The orientations of silicon wafers are classified using Miller indices. These indices include such descriptions as <100>, <111>, and <110>. In embodiments of the invention, the crystal orientations of the top surface of the formation assistance region and the sidewalls of the non-sacrificial nanosheets are configured such that a semiconductor growth process from the top surface of the formation assistance region is faster than the semiconductor growth process from the sidewalls of the non-sacrificial nanosheets. In some embodiments of the invention, the top surface of the formation assistance region has a <100> crystal orientation, and the sidewalls of the non-sacrificial nanosheets have a <110> crystal orientation, which results in the first sacrificial S/D contact layer growing significantly faster from the top surface of the formation assistance region than from the sidewalls of the non-sacrificial nanosheets. In embodiments of the invention, the first sacrificial S/D contact layer can be epitaxially grown from gaseous or liquid precursors using, for example, vapor-phase epitaxy (VPE), molecular-beam epitaxy (MBE), liquid-phase epitaxy (LPE), or other suitable process.

In embodiments of the invention, a doped S/D layer is grown from a top surface of the first sacrificial S/D contact layer, and the previously-described cyclic etch-back process is used to, in effect, suppress growth of the doped S/D layer from sidewalls of the non-sacrificial nanosheets. In embodiments of the invention, the doped S/D layer can be epitaxially grown from gaseous or liquid precursors using, for example, vapor-phase epitaxy (VPE), molecular-beam epitaxy (MBE), liquid-phase epitaxy (LPE), or other suitable process. The above-described growth processes are continued in an alternating pattern until the desired number of alternating sacrificial S/D contact layers and doped S/D layers are formed in a stack. At this fabrication stage, the resulting stack includes spaced-apart sacrificial S/D contact layers and spaced-apart doped S/D layers. In embodiments of the invention, the spaced-apart sacrificial S/D contact layers in the stack are physically coupled one to another by forming high aspect ratio sacrificial S/D contact layers physically coupled at end region sidewalls of the spaced-apart S/D contact layers in the stack.

In embodiments of the invention, a dielectric is formed around the above-described stack of alternating sacrificial S/D contact layers and doped S/D layers, and an upper S/D contact trench is formed in the dielectric to expose a portion of the top surface of the sacrificial S/D contact layer at the top of the stack. In embodiments of the invention, the sacrificial S/D contact layers (including the high aspect ratio S/D layers) are selectively removed to form a multi-region bottom S/D contact cavity having the shape and position of the removed sacrificial S/D contact layers. A multi-region bottom S/D contact is formed by depositing conductive material in the multi-region bottom S/D contact cavity, and an upper S/D contact is formed by depositing conductive material in the upper S/D contact trench. In accordance with aspects of the invention, the upper S/D contact is communicatively coupled to the multi-region bottom S/D contact to form a single wrap-around contact configured and arranged to wrap completely around each of the spaced-apart and stacked S/D layers that form the S/D region of the transistor. Because the multi-region bottom S/D contact wraps completely around each of the spaced-apart and stacked S/D layers that form the S/D region of the transistor, the contact area between the multi-region bottom S/D contact and each of the spaced-apart and stacked S/D layers is maximized without significantly introducing parasitic capacitance.

Turning now to a more detailed description of fabrication operations and resulting structures according to aspects of the invention, FIGS. 1-16 depict a nanosheet-based structure 100 after various fabrication operations for forming nanosheet FETs having stacked and spaced-apart S/D regions with formation assistance regions and multi-region wrap-around S/D contacts. For ease of illustration, the fabrication operations depicted in FIGS. 1-16 will be described in the context of forming one (1) nanosheet stack 130 (shown in FIG. 1) that is etched into three (3) nanosheet stacks 130 (shown in FIGS. 3-16). It is intended, however, that fabrication operations described herein apply equally to the fabrication of any number of the nanosheet stacks 130.

Although the cross-sectional diagrams depicted in FIGS. 1-16 are two-dimensional, it is understood that the diagrams depicted in FIGS. 1-16 represent three-dimensional structures. To assist with visualizing the three-dimensional features, the top-down reference diagram 101 shown in FIG. 1 provides a reference point for the various cross-sectional views (X-view, Y1-view, and Y2-view) shown in FIGS. 1-16. The X-view is a side view taken across the three gates, the Y1-view is an end view taken through the active gate, and the Y2-view is an end view taken through a portion of the nanosheet (NS) stack where one of the S/D regions is (or will be) formed.

FIG. 1 depicts cross-sectional views of the nanosheet-based structure 100 after initial fabrication operations in accordance with aspects of the present invention. As shown in FIG. 1, the nanosheet stack 130 is formed over the substrate 102. The nanosheet stack 130 includes an alternating series of SiGe sacrificial nanosheet layers 120, 122, 124, 126 and Si nanosheet layers 114, 116, 118. In accordance with aspects of the invention, the alternating nanosheet layers 120, 122, 114, 124, 116, 126, 118 of the nanosheet stack 130 are formed by epitaxially growing one nanosheet layer then the next until the desired number and desired thicknesses of the nanosheet layers are achieved. A hard mask layer (not shown) is deposited over the alternating nanosheet layers 120, 122, 114, 124, 116, 126, 118, and the hard mask layer and the alternating nanosheet layers 120, 122, 114, 124, 116, 126, 118 are etched to define the hard mask (HM) 128, the nanosheet stack 130, and the sub-fin 102A of the substrate 102. The hard mask layer and the resulting HM 128 can be any suitable dielectric, including but not limited to SiN.

In embodiments of the invention, each of the nanosheet layers 120, 122, 114, 124, 116, 126, 118 can have a vertical direction thickness in the range from about 5 nm to about 20 nm, in the range from about 10 nm to about 15 nm, or about 10 nm. Other vertical direction thicknesses are contemplated. Although seven (7) alternating layers 120, 122, 114, 124, 116, 126, 118 are depicted in the figures, any number of alternating layers can be provided.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, the SiGe sacrificial nanosheet layers 122, 124, 126 can be about SiGe 20%. The notation "SiGe 20%" is used to indicate that 20% of the SiGe material is Ge and 80% of the SiGe material is Si. In some embodiments of the invention, the Ge percentage in the SiGe sacrificial nanosheet layers 122, 124, 126 can be any value, including, for example a value within the range from about 20% to about 45%.

In embodiments of the invention, the SiGe sacrificial nanosheet layer 120 has a Ge percentage that is sufficiently greater than the Ge percentage in the SiGe sacrificial nanosheet layers 122, 124, 126 to provide etch selectivity between the sacrificial nanosheet layer 120 and the sacrificial nanosheet layers 122, 124, 126. In some aspects of the invention, the Ge percentage in the SiGe sacrificial nanosheet layer 120 is above about 55%. In some aspects of the invention, the sacrificial nanosheet layers 122, 124, 126 can be SiGe 25%, and the sacrificial nanosheet layer 120 can be at or above about SiGe 55%.

Figure 2:
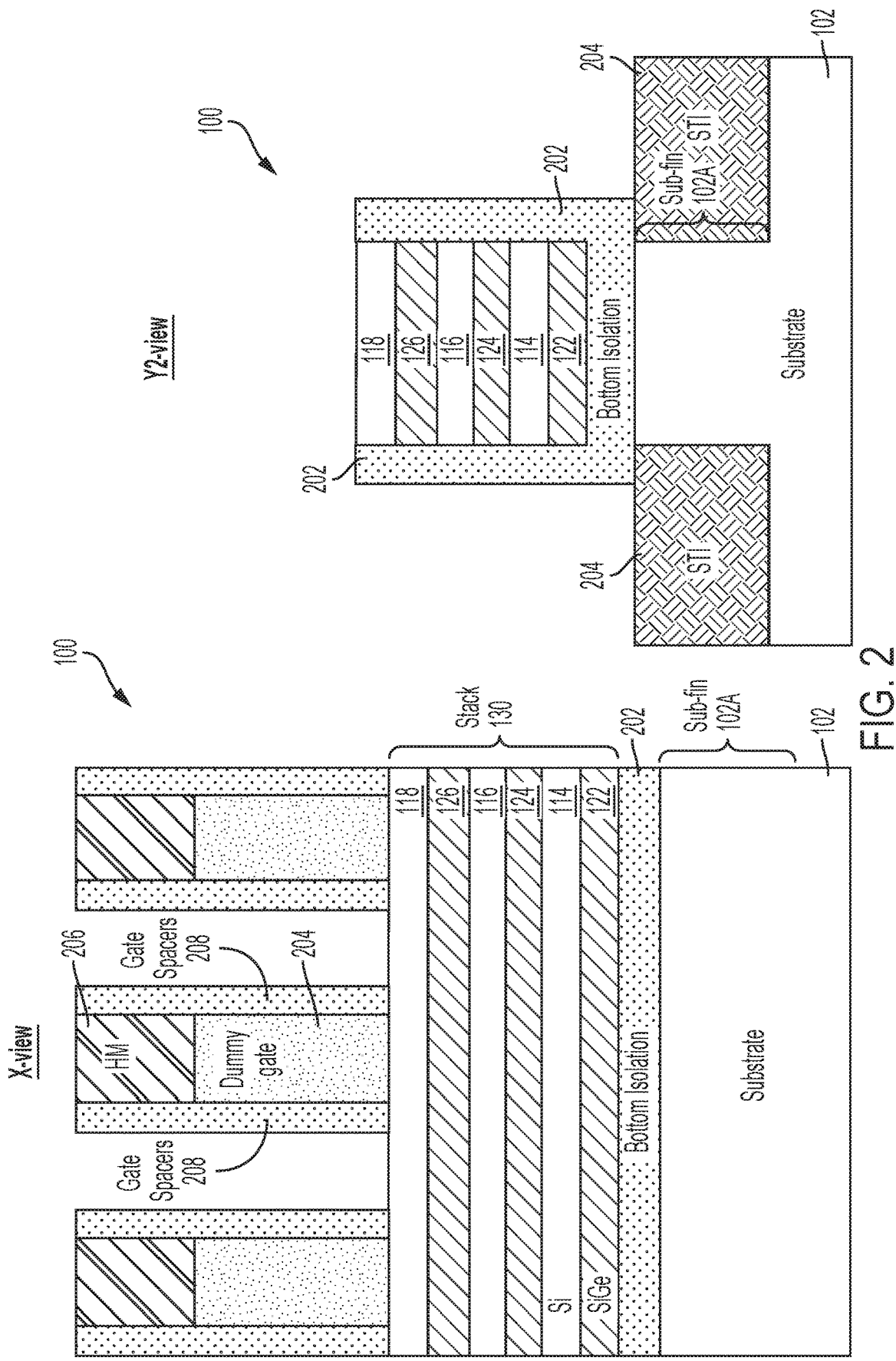

In FIG. 2, known fabrication operations have been used to, prior to formation of dummy gates 204, deposit a thin layer of gate oxide (not shown separately) over the nanosheet stack 130. In FIG. 2, the dummy gate 204 represents the combination of the thin layer of gate oxide (e.g., $SiO_2$) and a material (e.g., amorphous silicon (a-Si)) from which the dummy gates 204 are formed.

Referring still to FIG. 2, known fabrication operations (e.g., an RIE) have been used to form dummy gates 204. In embodiments of the invention, the dummy gates 204 can be formed by depositing and planarizing a layer of dummy gate material (not shown) over the gate oxide (not shown separately from the topmost nanosheet 118). In some embodiments of the invention, the dummy gate material can be polycrystalline Si. In some embodiments of the invention, the dummy gate material can be amorphous Si (a-Si). After being deposited, the dummy gate material is planarized (e.g., by CMP) to a desired level. Known semiconductor fabrication operations are used to form patterned/etched hard masks 206 on a top surface of the planarized dummy gate material. In embodiments of the invention, the hard masks 206 can be formed by depositing a layer of hard mask material and patterning then etching the deposited hard mask layer to form the hard masks 206. The pattern used to form the hard masks 206 defines the footprints of the dummy gates 204 and the gate oxide. In embodiments of the invention, the hard masks 206 can be formed from oxide and/or nitride materials. The dummy gate material is selectively etched such that portions of the dummy gate material that are not under the hard masks 206 are selectively removed, thereby forming the dummy gates 204 over the gate oxide and the nanosheet stack 130.

Referring still to FIG. 2, known fabrication operations have been used to selectively remove the portions of the gate oxide that are not under the dummy gates 204, and a DHF cleaning has been performed to ensure that all of the gate oxide that is not under the dummy gates 204 has been removed.

Referring still to FIG. 2, known fabrication operations have been used to selectively remove the bottommost SiGe sacrificial nanosheet layer 120 (shown in FIG. 1) followed by depositing dielectric material used to form offset gate spacers 208 on sidewalls of the dummy gates 204. The deposited dielectric material also fills in the space that was occupied by the removed sacrificial nanosheet layer 120, thereby forming the bottom isolation region 202, which will isolate the substrate 102 from the to-be-formed S/D regions (e.g., S/D layers 902A, 902B, 902C shown in FIG. 10). In embodiments of the invention, the offset gate spacers 208 can be formed by depositing the dielectric material over the nanosheet-base structure 100 then directionally etching (e.g., using an RIE) the dielectric material to form the gate spacers 208. In embodiments of the invention, the offset gate spacers 208 and the bottom isolation 202 can be formed from any suitable dielectric material including, for example, silicon oxide, silicon nitride, silicon oxynitride, SiBCN, SiOCN, SiOC, or any suitable combination of those materials. In some embodiments of the invention, the offset gate spacers 208 and/or the bottom isolation region 202 can be a low-k dielectric material.

Referring still to FIG. 2, as best shown in the Y2-view, a shallow trench isolation (STI) region 204 has been formed adjacent the sub-fin 102a. In embodiments of the invention, the STI region 204 can be formed as an oxide. An example process to form the STI region 204 includes depositing an STI dielectric material (e.g., an oxide) (not shown) adjacent the sub-fin 102a followed by a CMP planarization and a recess of the STI dielectric material to form the STI region 204.

Figure 3:
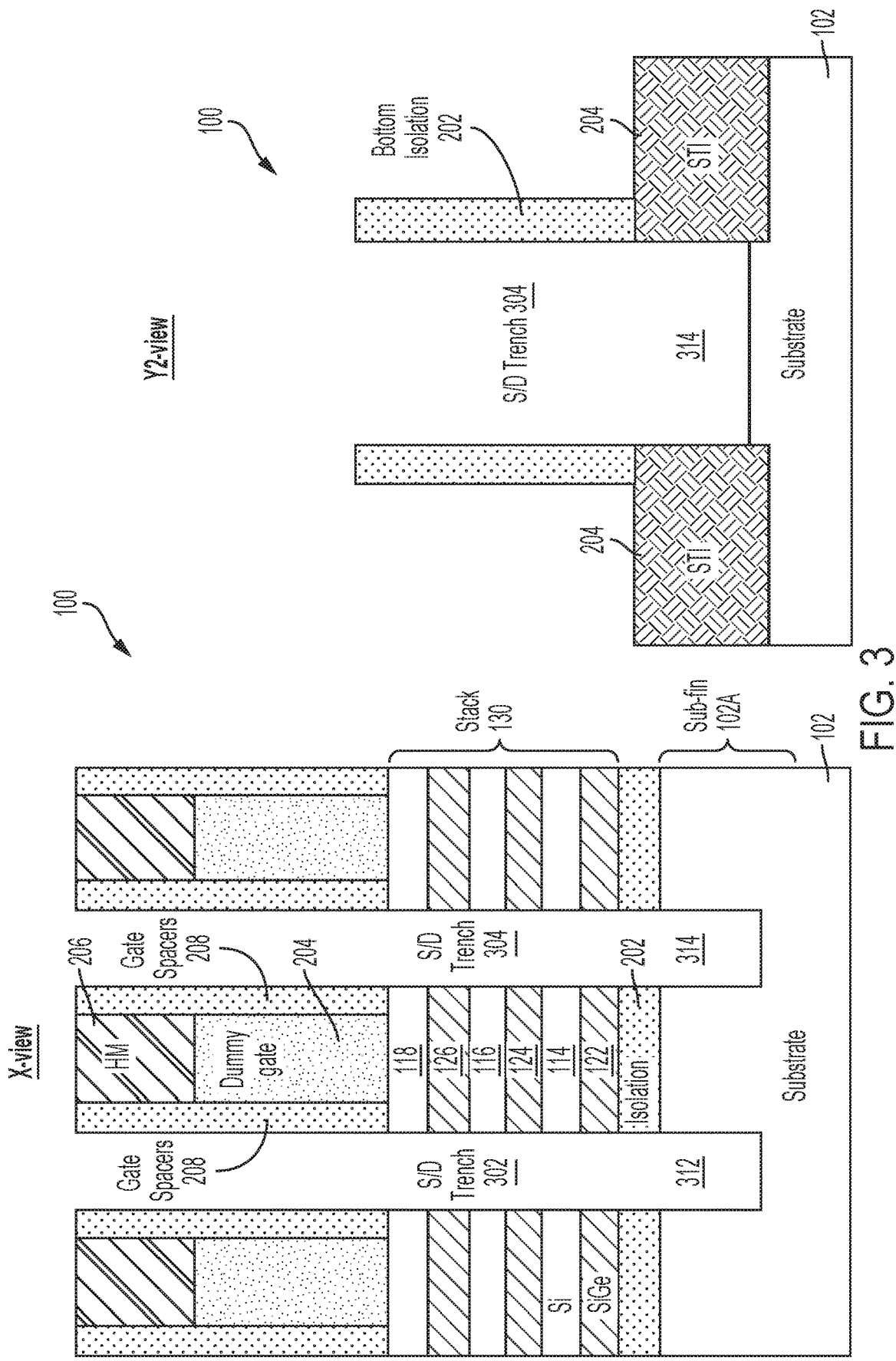

In FIG. 3, the portions of the nanosheet stack 130 that are not covered by the gate spacers 208 and the dummy gates 204 are etched, thereby forming multiple instances of the nanosheet stack 130; forming alternating layers of SiGe sacrificial nanosheets 122, 124, 126 and Si nanosheets 114, 116, 118 in each instance of the nanosheet stacks 130; forming S/D trenches 302, 304; providing access to end regions of the SiGe sacrificial nanosheets 122, 124, 126; and providing access to end regions of the Si nanosheets 114, 116, 118. In accordance with aspects of the invention, each of the S/D trenches 302, 304 includes bottom cavities 312, 314 that extend through the bottom isolation 202 and into the substrate 102. Of the 3 (three) nanosheet stacks 130 shown in FIG. 3, the center nanosheet stack 130 will be used to form an active nanosheet transistor. The rightmost and leftmost nanosheet stacks 130 can each be part of an active or inactive transistor depending on the requirements of the IC design in which the nanosheet-based structure 100 will be incorporated. Where the rightmost and/or leftmost nanosheet stack 130 is part of an active transistor, the active transistor formed from rightmost and/or leftmost nanosheet stack 130 will be in series with the transistor formed from the center nanosheet stack 130 and will share a source or drain region with the transistor formed from the center nanosheet stack 130. Whether or not the transistors formed from the rightmost and leftmost nanosheet stacks 130 are active, the rightmost and leftmost nanosheet stacks 130 define portions of the S/D trenches 302, 304 in which the spaced-apart doped S/D layers 902A, 902B, 902C (shown in FIG. 16) will be formed.

Figure 4:
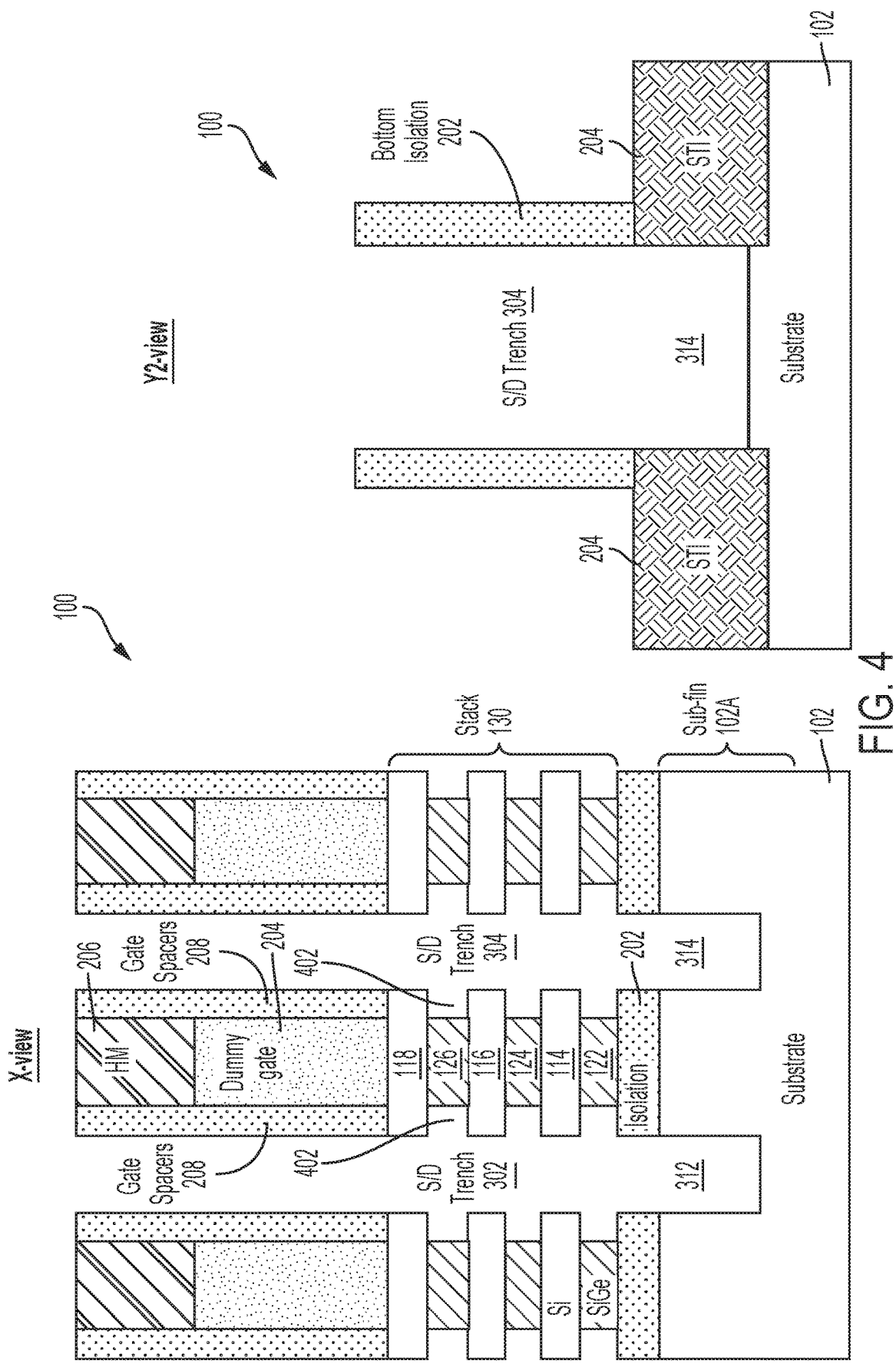

In FIG. 4, known semiconductor fabrication processes have been used to partially remove end regions of the SiGe sacrificial nanosheets 122, 124, 126 to form end region or inner spacer cavities 402. In embodiments of the invention, the end regions of the SiGe sacrificial nanosheets 122, 124, 126 can be removed using a so-called "pull-back" process to pull the SiGe sacrificial nanosheets 122, 124, 126 back an initial pull-back distance such that the ends of the SiGe sacrificial nanosheets 122, 124, 126 now terminate at about an inner edge of the gate spacers 208. In embodiments of the invention, the pull-back process leverages the fact that the sacrificial nanosheets 122, 124, 126 are formed from SiGe, which can be selectively etched with respect to the Si nanosheets 114, 116, 118 using, for example, a vapor phase hydrogen chloride (HCL) gas isotropic etch process.

Figure 5:
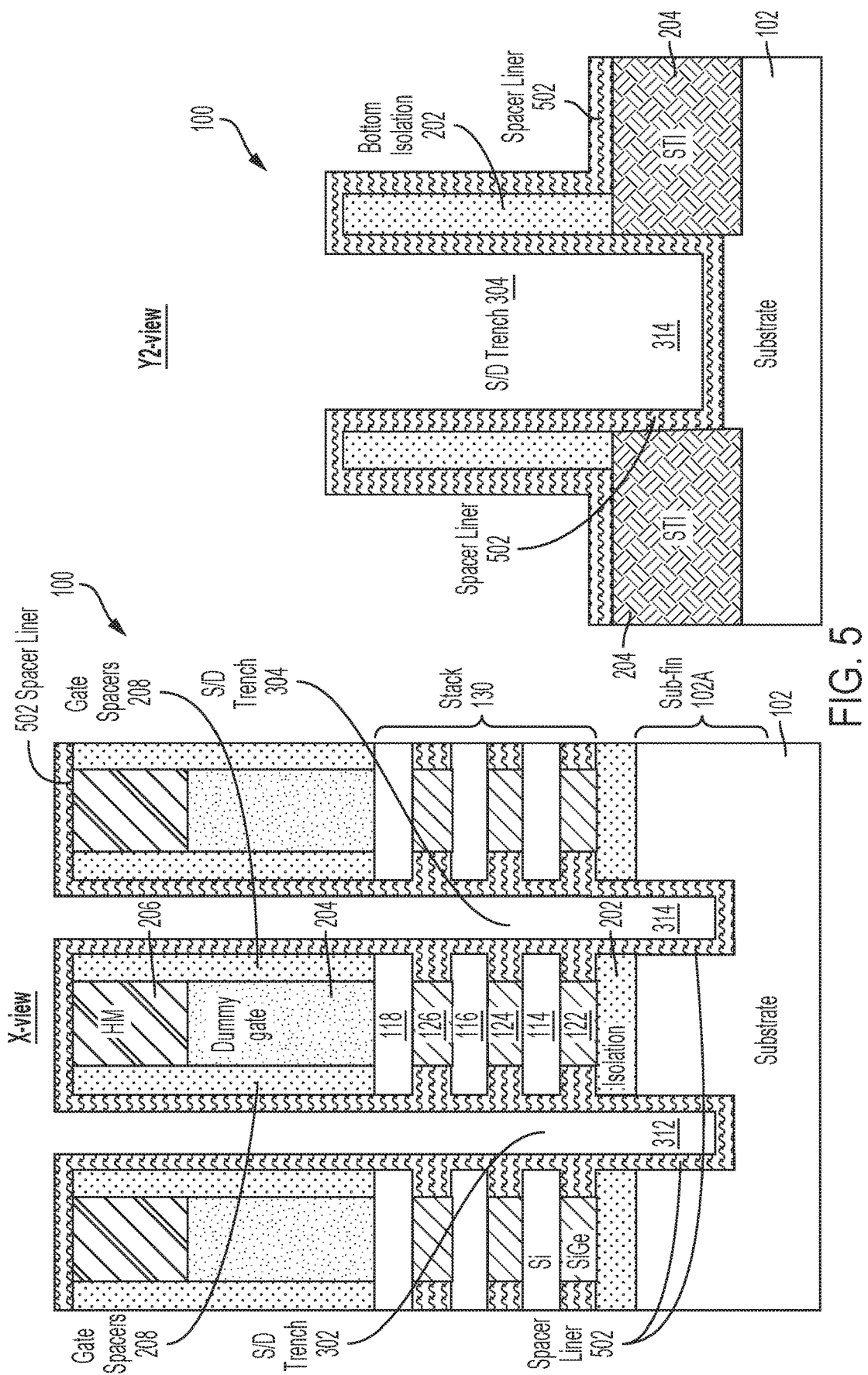

In FIG. 5, known semiconductor fabrication operations (e.g., ALD) have been used to conformally deposit a layer of inner spacer liner material 502 over the nanosheet-based structure 100. The inner spacer liner layer 502 can be silicon nitride, siliconboron carbonitride, silicon carbonitride, silicon carbon oxynitride, or any other type of dielectric material (e.g., a dielectric material having a dielectric constant k of less than about 5).

Figure 6:
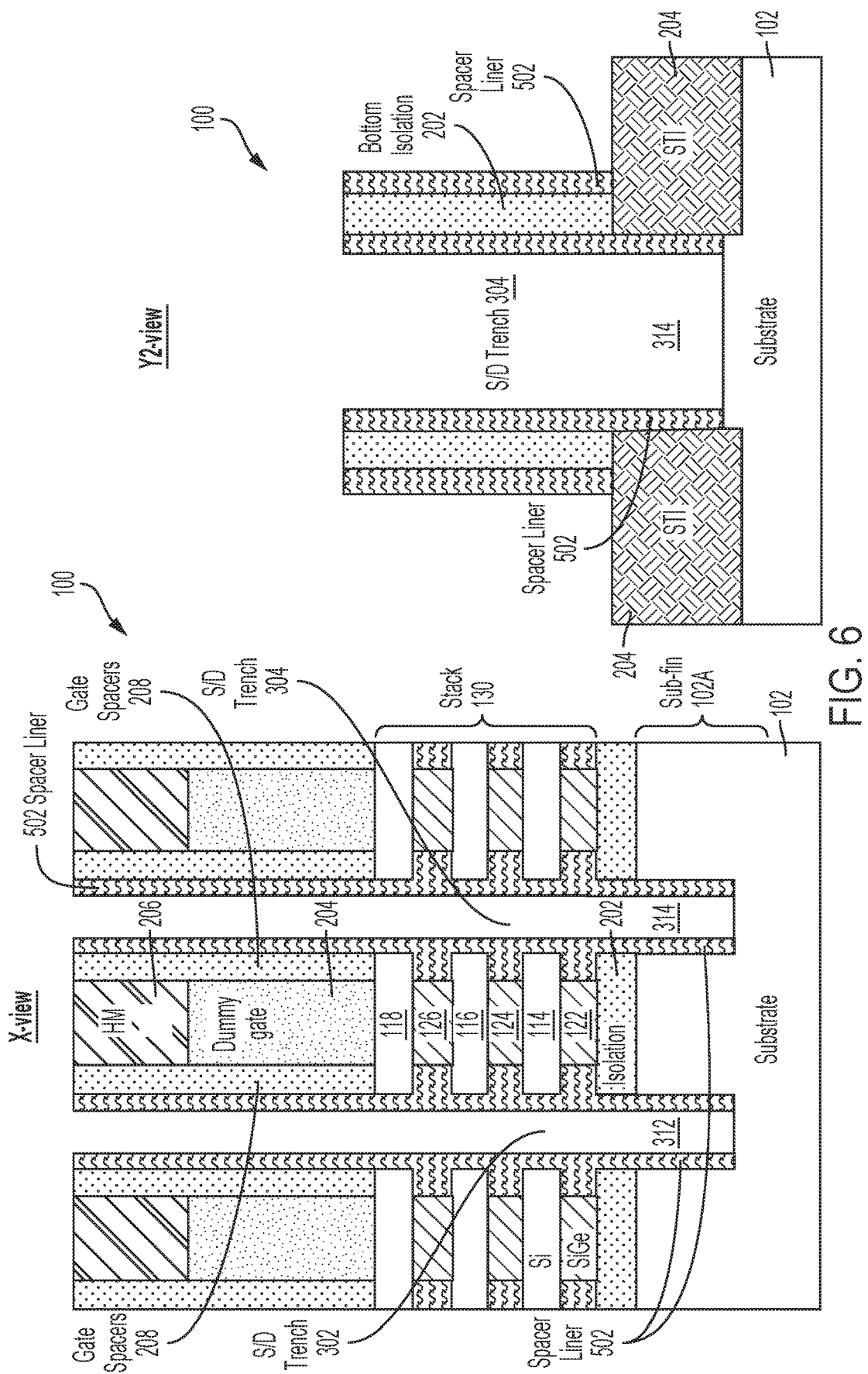

In FIG. 6, known semiconductor fabrication operations (e.g., an anisotropic RIE) can be used to remove the inner spacer material 502 from horizontal surfaces of the nanosheet-based structure 100, thereby exposing portions of the top surfaces of the substrate 102 at the bottom of the bottom cavities 312, 314. In embodiments of the invention, the exposed top surfaces of the substrate 102 have a <100> orientation.

Figure 7:
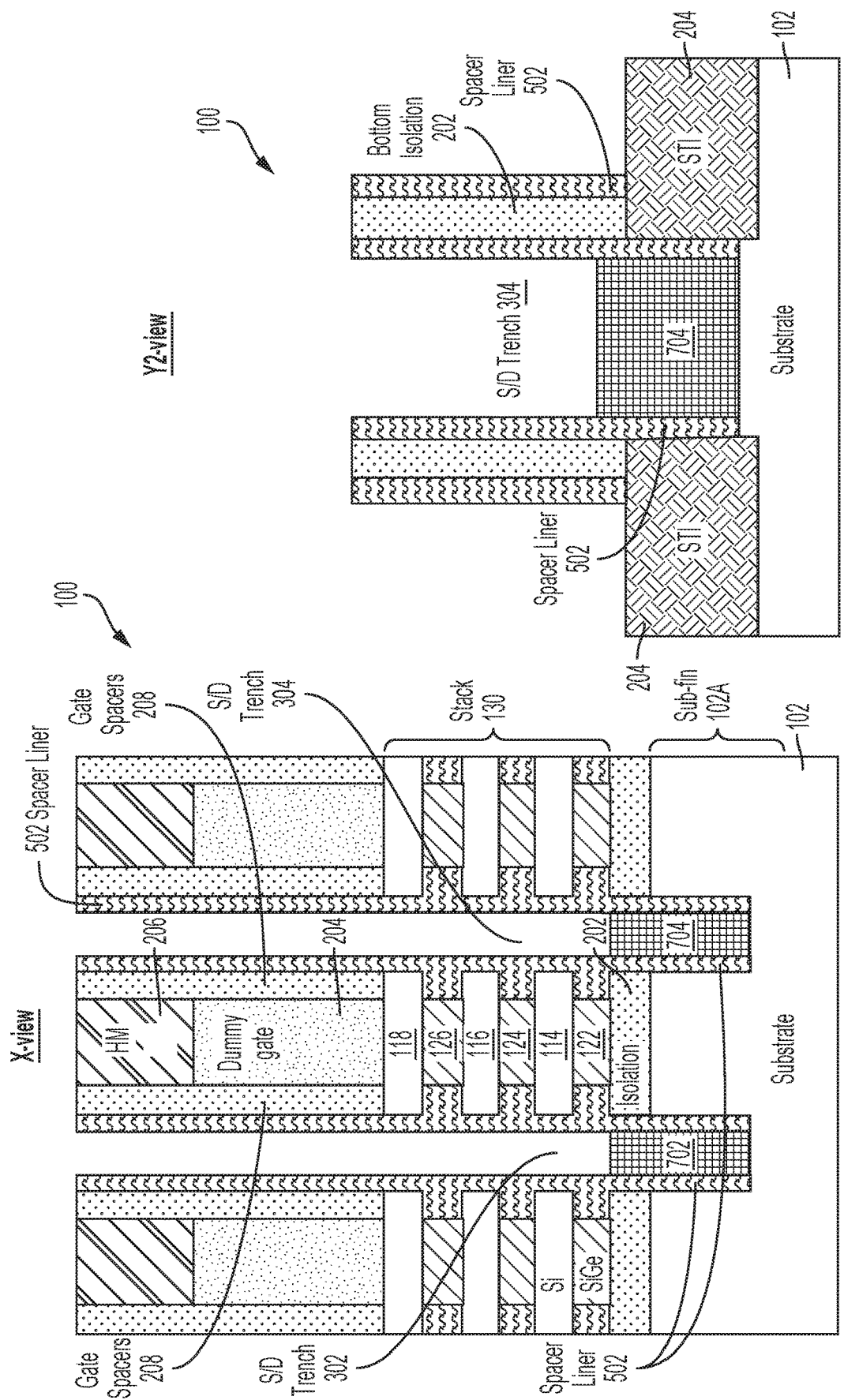

In FIG. 7, known fabrication operations have been used to initiate a process for forming the spaced-apart sacrificial S/D contact layers 802A, 802B, 802C (shown in FIG. 12) and the spaced-apart doped S/D layers 902A, 902B, 902C (shown in FIG. 16) in accordance with aspects of the invention. In embodiments of the invention, the initial stages of the process for forming the spaced-apart sacrificial S/D contact layers 802A, 802B, 802C (shown in FIG. 12) and the spaced-apart doped S/D layers 902A, 902B, 902C uses an in-situ doped growth process to grow separate individual formation assistance regions 702, 704 from the <100> exposed top surfaces of the substrate 102 at the bottom of the cavities 312, 314 (shown in FIG. 6). In embodiments of the invention where the nanosheet-based structure 100 will form an n-type FET, the formation assistance regions 702, 704 can start as p-type in bottom portions of the formation assistance regions 702, 704 to provide isolation, and then turn to intrinsic or n-type in top portions of the formation assistance regions 702, 704. In embodiments of the invention where the nanosheet-based structure 100 will form a p-type FET, the formation assistance regions 702, 704 can start as n-type in bottom portions of the formation assistance regions 702, 704 to provide isolation, and then turn to intrinsic or p-type in top portions of the formation assistance regions 702, 704. In some embodiments of the invention, the formation assistance regions 702, 704 can be formed by initially forming intrinsic semiconductor material followed by punch through stopper (PTS) implants into the formation assistance regions 702, 704 for isolation.

Figure 8:
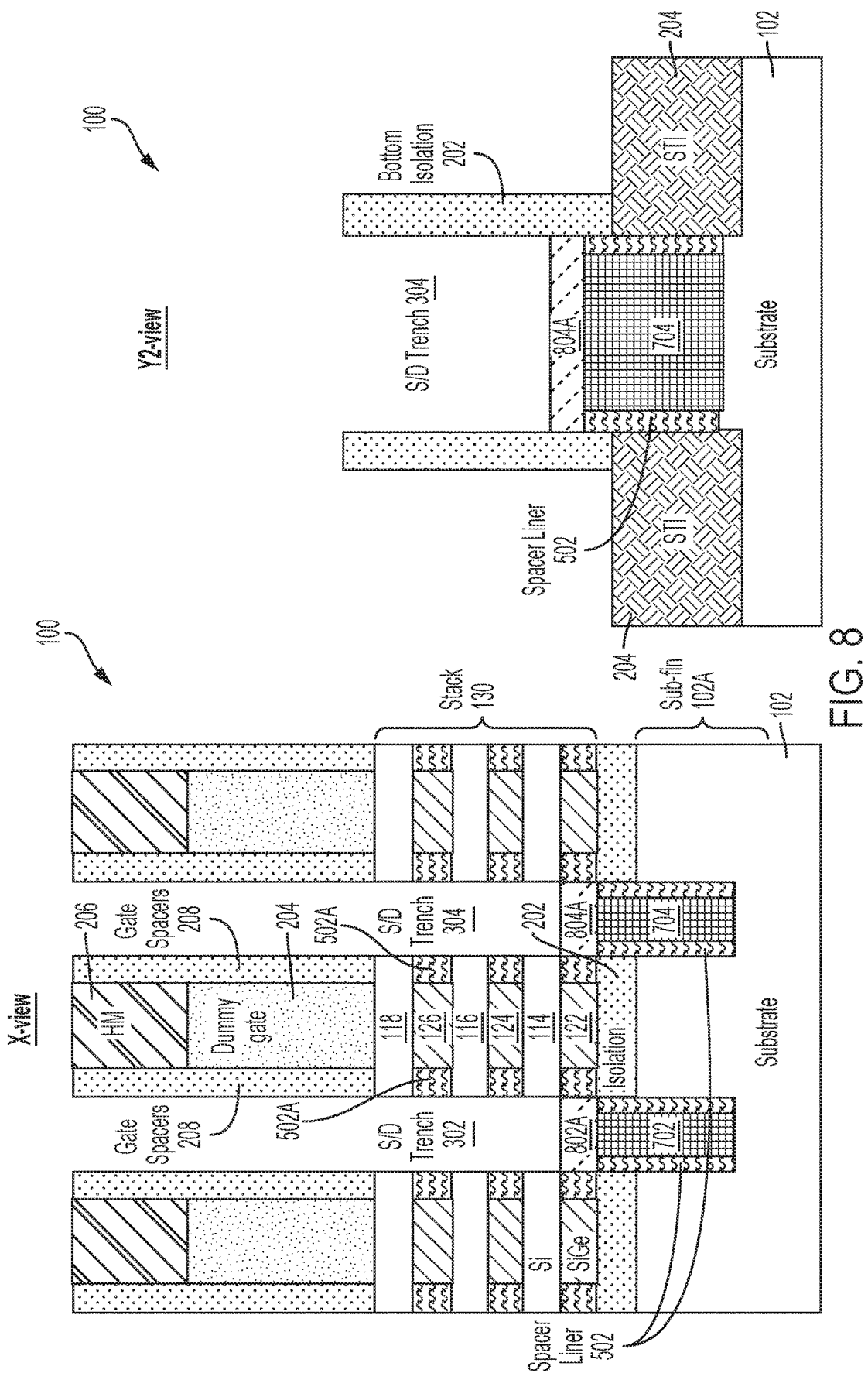

In FIG. 8, known semiconductor device fabrication processes have been used to form inner spacers 502A. In embodiments of the invention, the inner spacers 502A can be formed using by applying an isotropic etch back on the inner spacer layer 502 (shown in FIG. 7) to remove excess dielectric material on exposed vertical and horizontal surfaces of the nanosheet-based structure 100, thus leaving the portions of the inner spacer layer 502 that pinched off in the inner spacer cavities 402 (shown in FIG. 4), thereby forming the inner spacers 502A.

Referring still to FIG. 8, known semiconductor device fabrication processes have been used to form sacrificial S/D contact layers 802A, 804A. In embodiments of the invention, the sacrificial S/D contact layers 802A, 804A can be grown from the exposed <100> top surfaces of the formation assistance regions 702, 704, and the previously-described cyclic etch-back process is used to, in effect, suppress growth of the sacrificial S/D contact layers 802A, 804A from sidewalls of the non-sacrificial nanosheets 114, 116, 118. In embodiments of the invention, the cyclic etch-back process leverages different epitaxial growth rates that result from different crystal orientations in the semiconductor crystals that form the transistor. In general, the wafers in/on which transistors are formed are grown on crystals that have a regular crystal structures. When wafers are sliced from the crystal, the surface is aligned in one of several relative directions, known as the orientation or the growth plane of the crystalline silicon. The orientations of silicon wafers are classified using Miller indices. These indices include such descriptions as <100>, <111>, and <110>. In embodiments of the invention, the crystal orientations of the top surfaces of the formation assistance regions 702, 704 and the sidewalls of the non-sacrificial nanosheets 114, 116, 118 are configured such that a semiconductor growth process from the top surface of the formation assistance regions 702, 704 is faster than the semiconductor growth process from the sidewalls of the non-sacrificial nanosheets 114, 116, 118. In some embodiments of the invention, the top surfaces of the formation assistance regions 702, 704 have a <100> crystal orientation, and the sidewalls of the non-sacrificial nanosheets 114, 116, 118 have a <110> crystal orientation, which results in the sacrificial S/D contact layers 802A, 804A growing significantly faster from the top surfaces of the formation assistance regions 702, 704 than from the sidewalls of the non-sacrificial nanosheets 114, 116, 118.

Figure 15:
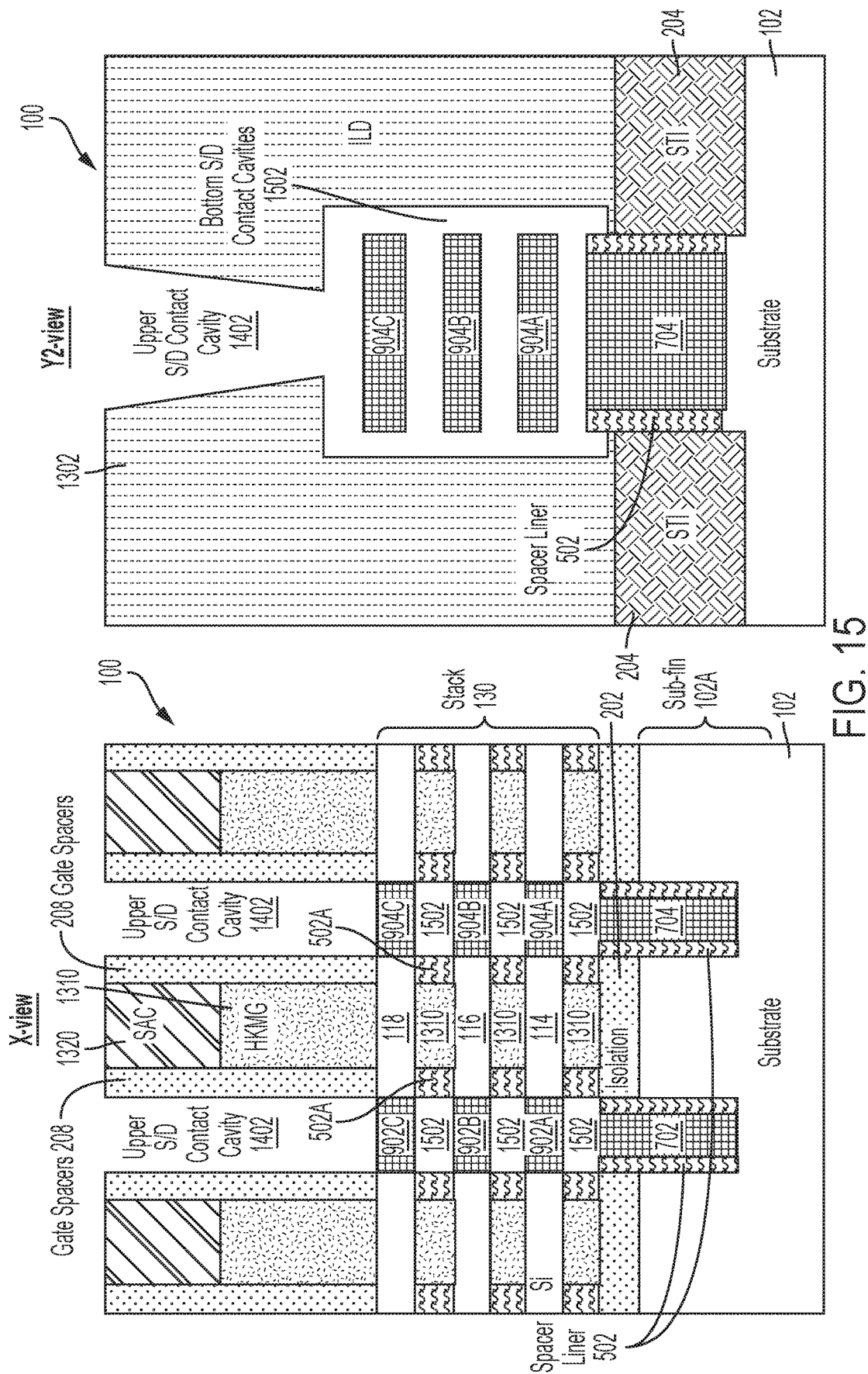

In embodiments of the invention, the sacrificial S/D contact layers 802A, 804A can be epitaxially grown from gaseous or liquid precursors using, for example, vapor-phase epitaxy (VPE), molecular-beam epitaxy (MBE), liquid-phase epitaxy (LPE), or other suitable process. In accordance with aspects of the invention, the sacrificial S/D contact layers 802A, 804A can be from a material that will epitaxially grow from the formation assistance regions 702, 704, and that will have sufficient etch selectivity that it can be selectively removed during downstream fabrication operations. In some embodiments of the invention, the sacrificial S/D contact layers 802A, 804A, as well as the to-be-formed segments of the multi-region sacrificial lower S/D contacts 804 (shown in FIG. 12) are formed from SiGe having sufficient etch selectivity (e.g., SiGe 85%) to the remaining portions of the nanosheet-based structure 100 that the sacrificial S/D contact layers 802A, 804A, as well as the to-be-formed segments of the multi-region sacrificial lower S/D contacts 804, can be selectively removed by downstream fabrication operations (e.g., as shown in FIG. 15).

Figure 9:
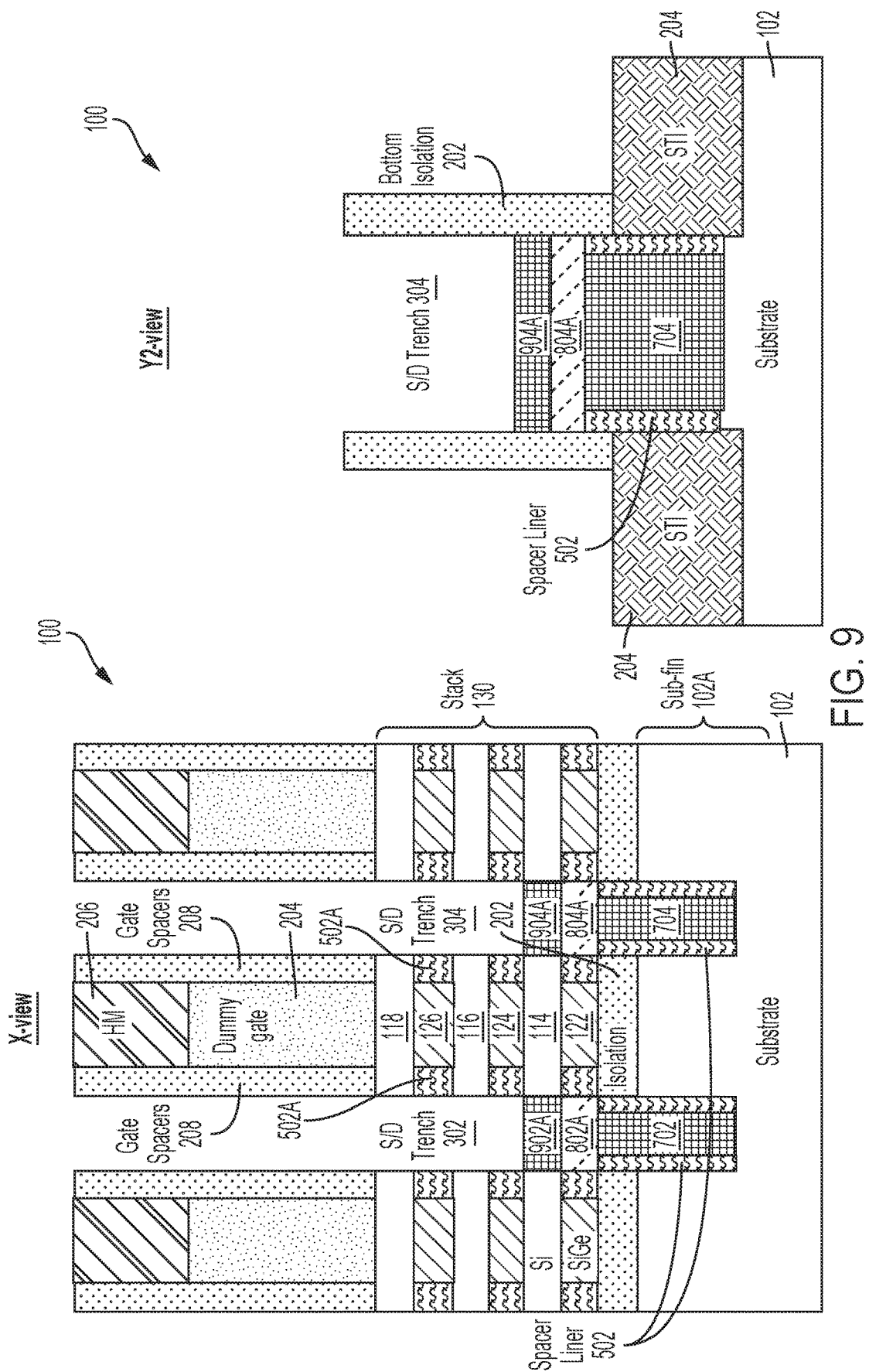

In FIG. 9, known semiconductor device fabrication processes have been used to form doped S/D layers 902A, 904A. In embodiments of the invention, the doped S/D layers 902A, 904A can be grown from top surfaces of the sacrificial S/D contact layers 802A, 804A, respectively, and the previously-described cyclic etch-back process has been used to, in effect, suppress growth of the doped S/D layers 902A, 904A from sidewalls of the non-sacrificial nanosheets 114, 116, 118. In embodiments of the invention, the doped S/D layers 902A, 904A can be epitaxially grown from gaseous or liquid precursors using, for example, vapor-phase epitaxy (VPE), molecular-beam epitaxy (MBE), liquid-phase epitaxy (LPE), or other suitable process. In embodiments of the invention, the doped S/D layers 902A, 904A, as well as the to-be-formed doped S/D layers 902B, 902C, 904B, 904C (shown in FIG. 10), can be doped during deposition (e.g., in-situ doped) by adding dopants such as n-type dopants (e.g., phosphorus or arsenic) or p-type dopants (e.g., Ga, B, $BF_2$, or Al) during the above-described methods of forming the doped S/D layers 902A, 904B. To reduce S/D contact resistance, the doped S/D layers 902A, 904A, as well as the to-be-formed doped S/D layers 902B, 902C, 904B, 904C, can be highly doped (e.g., doping levels of about $1\times10^{20}$ $cm^{-3}$ to about $1\times10^{21}$ $cm^{-3}$) and can be formed from $Si_{1-x}Ge_x$ having a higher Ge % (e.g., Ge %≥about 50%). In embodiments of the invention, the Ge % in the $Si_{1-x}Ge_x$ embodiments of the doped S/D layers 902A, 904A, as well as the to-be-formed doped S/D layers 902B, 902C, 904B, 904C, can be selected to maximize the dopant solubility in the $Si_{1-x}Ge_x$ doped S/D layers 902A, 904A, as well as the to-be-formed doped S/D layers 902B, 902C, 904B, 904C. For example, it is generally accepted that a Ge % that can maximize the B solubility in $Si_{1-x}Ge_x$ embodiments of the S/D regions 1302, 1304 is a Ge %≥about 65%. In embodiments of the invention, the dopant concentration in the doped S/D layers 902A, 904A, as well as the to-be-formed doped S/D layers 902B, 902C, 904B, 904C, can range from about $1\times10^{19}$ $cm^{-3}$ to about $2\times10^{21}$ $cm^{-3}$, or between about $2\times10^{20}$ $cm^{-3}$ and about $1\times10^{21}$ $cm^{-3}$.

Figure 10:
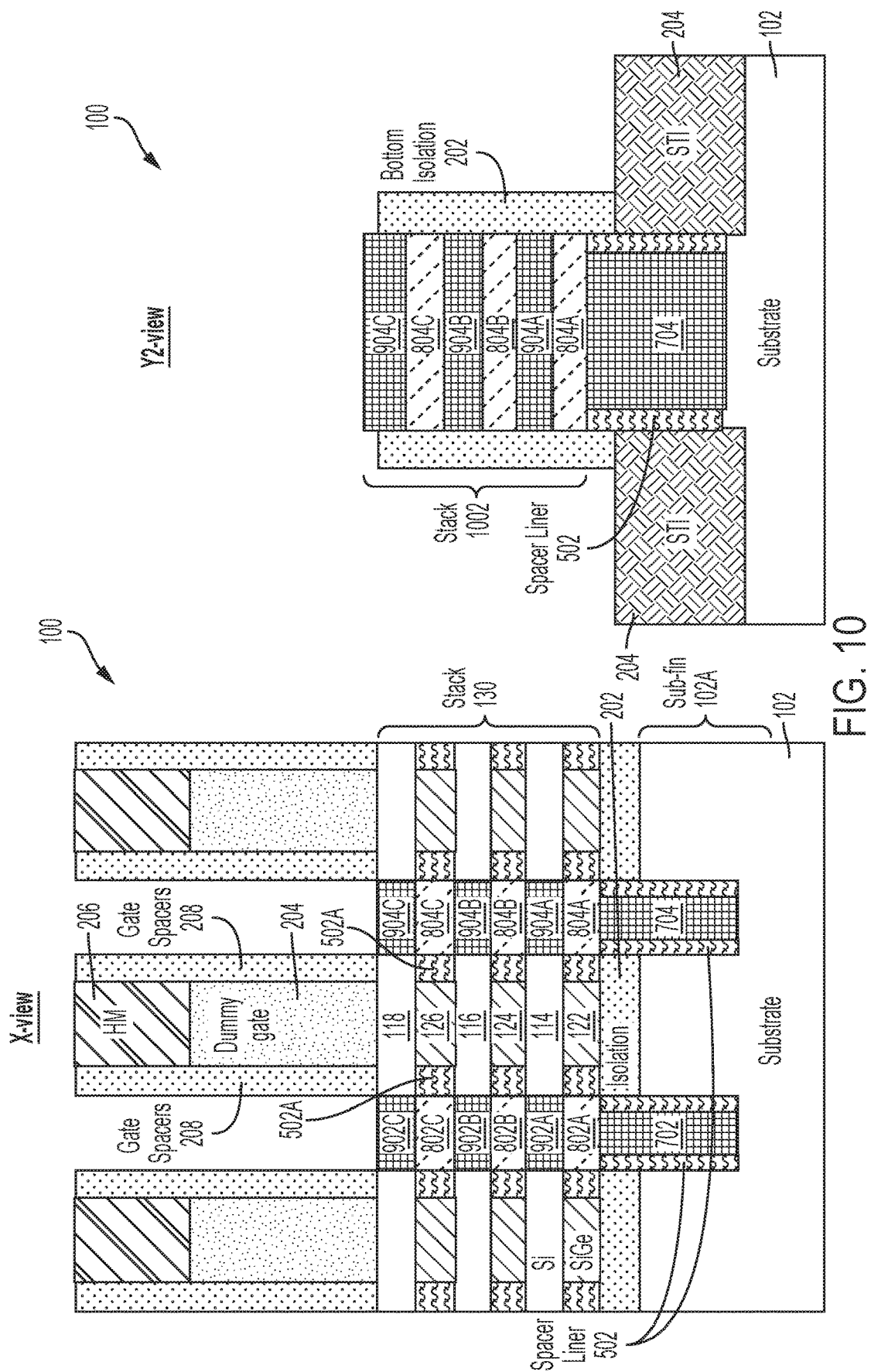

In FIG. 10, the fabrication processes depicted in FIGS. 7 and 8 have been repeated in an alternating pattern until the desired number of alternating sacrificial S/D contact layers 802A, 802B, 802C, 804A, 804B, 804C and doped S/D layers 902A, 902B, 902C, 904A, 904B, 904C are formed into stacks 1002. At this fabrication stage, as shown in the X-view of FIG. 10, the leftmost instance of the stacks 1002 includes spaced-apart sacrificial S/D contact layers 802A, 802B, 802C and spaced-apart doped S/D layers 902A, 902B, 902C, and the rightmost instance of the stacks 1002 includes spaced-apart sacrificial S/D contact layers 804A, 804B, 804C and spaced-apart doped S/D layers 904A, 904B, 904C.

Figure 11:
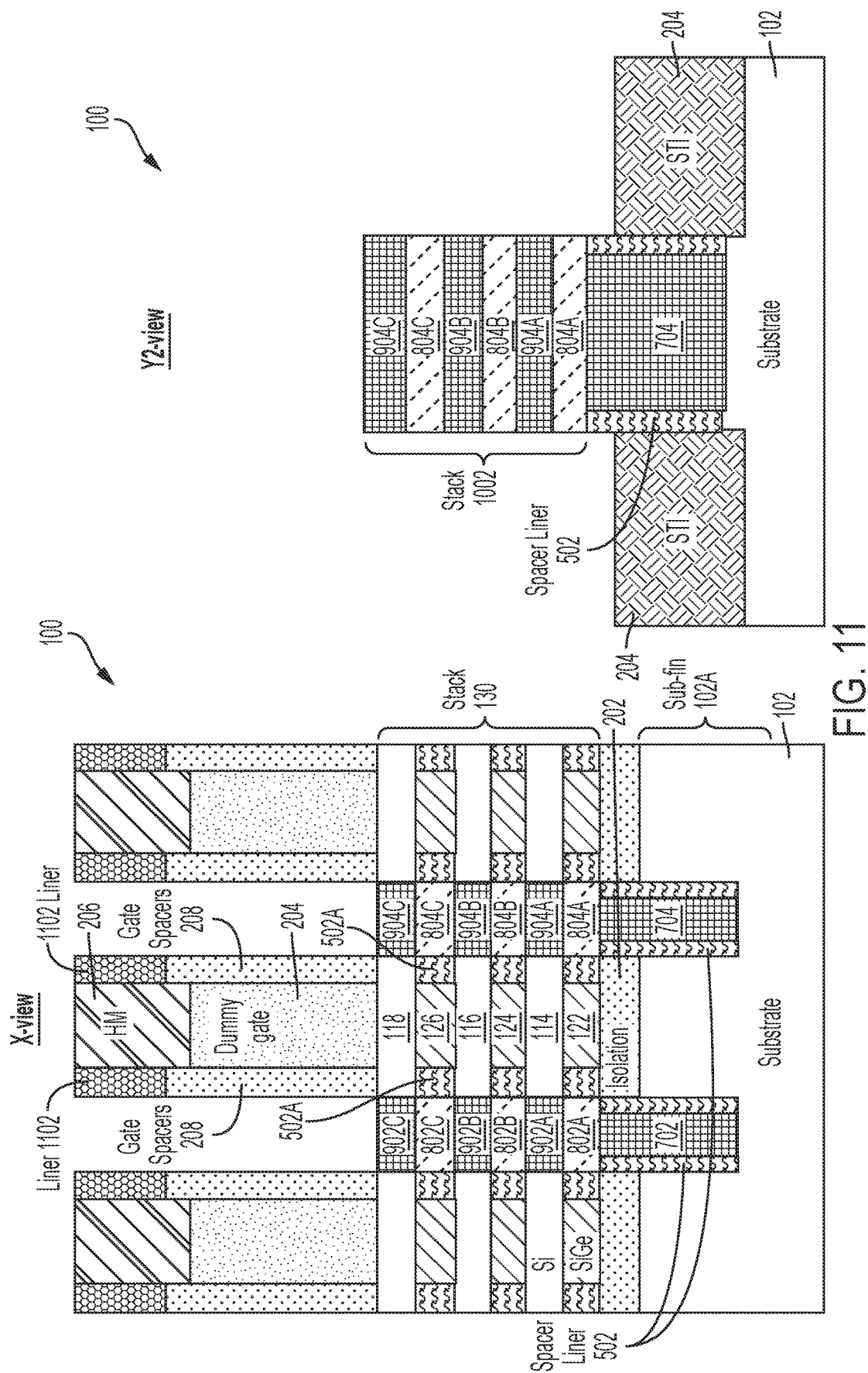

In FIG. 11, known semiconductor fabrication processes have been used to form protective spacer liners 1102 configured and arranged to protect the gate spacers 208 during subsequent fabrication operations. In embodiments of the invention, the protective spacer liner 1102 can be formed from any material (e.g., a nitride) that will not degrade from exposure to the various etch operations used in downstream fabrication processes, and that can be removed selectively with respect to the gate spacers 208.

Referring still to FIG. 11, known semiconductor fabrication processes have been used to remove the bottom isolation 202 (shown in FIG. 10) from sidewalls of the stacks 1002. Any known suitable etch process (such as anisotropic spacer RIE) can be used remove the bottom isolation 202 (shown in FIG. 10) from sidewalls of the stacks 1002 without damaging the gate spacers 208 which are masked by the liners 1102.

Figure 12:
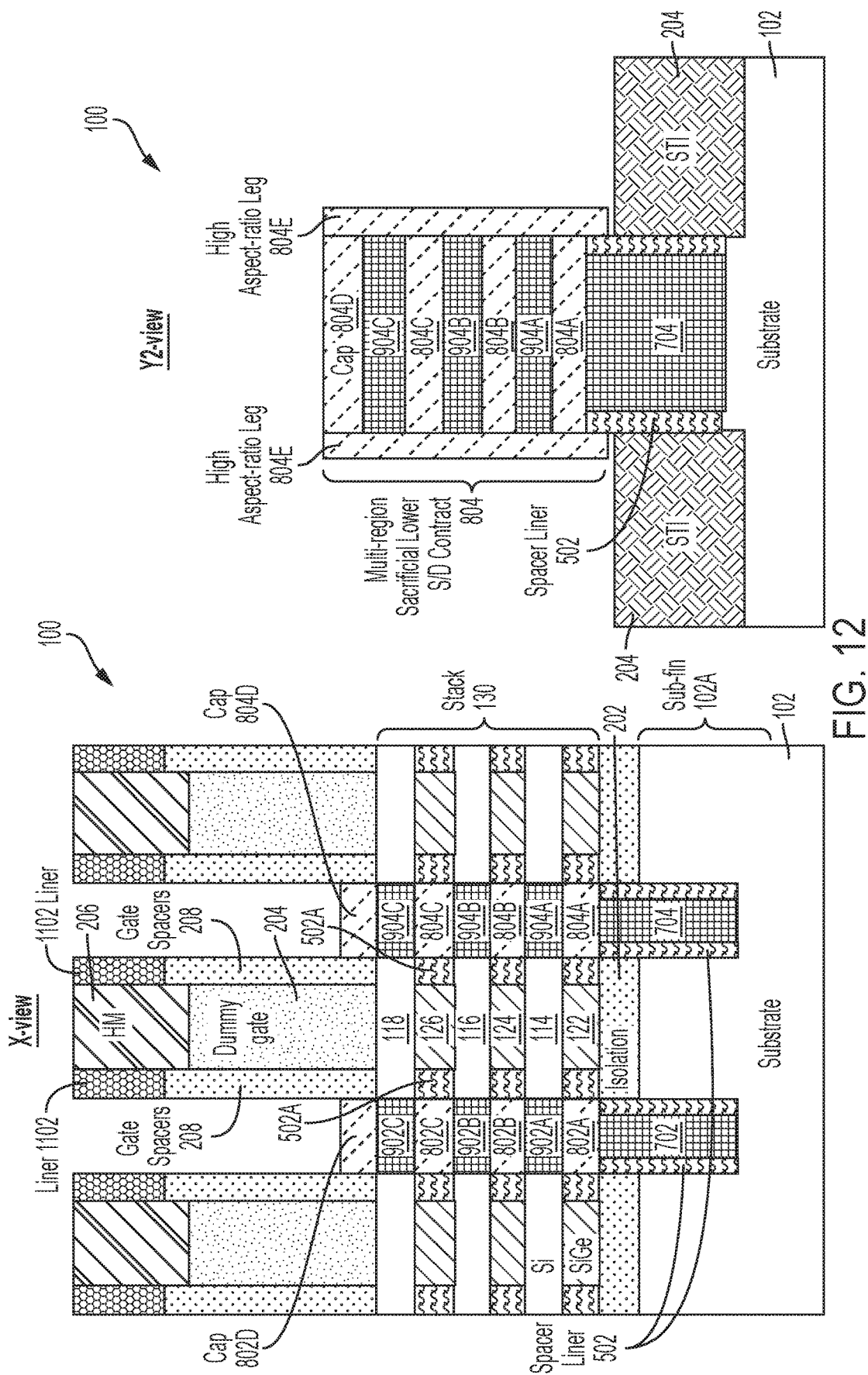

In FIG. 12, known semiconductor device fabrication processes have been used to form sacrificial S/D contact capping layers 802D, 804D and high aspect-ratio sacrificial S/D contact leg regions. For ease of illustration, only the rightmost X-view high aspect-ratio sacrificial S/D contact leg regions 804D are shown in the Y2-view, although it is understood that a corresponding leftmost X-view set of high aspect-ratio sacrificial S/D contact leg regions are also provided for the sacrificial S/D contact capping layer 802D. After the fabrication operations shown in FIG. 12, the sacrificial S/D contact capping layer 804D and the high aspect-ratio sacrificial S/D contact leg regions 804E form a multi-region sacrificial lower S/D contacts 804. In embodiments of the invention, the sacrificial S/D contact layers 802D, 804D can be grown from the exposed <100> top surfaces of the doped S/D layers 902C, 904C, and the high aspect-ratio sacrificial S/D contact leg regions 804E can be grown from end region sidewalls of the stack 1002 (best shown in the Y2-view of FIG. 11). In embodiments of the invention, the sacrificial S/D contact capping layers 802D, 804D and high aspect-ratio sacrificial S/D contact leg regions 804E can be epitaxially grown from gaseous or liquid precursors using, for example, vapor-phase epitaxy (VPE), molecular-beam epitaxy (MBE), liquid-phase epitaxy (LPE), or other suitable process. In embodiments of the invention, the spaced-apart sacrificial S/D contact layers 902A, 902B, 902C, 904A, 904B, 904C in the stack 1002 are physically coupled one to another by the high aspect-ratio sacrificial S/D contact regions 804E.

Figure 13:
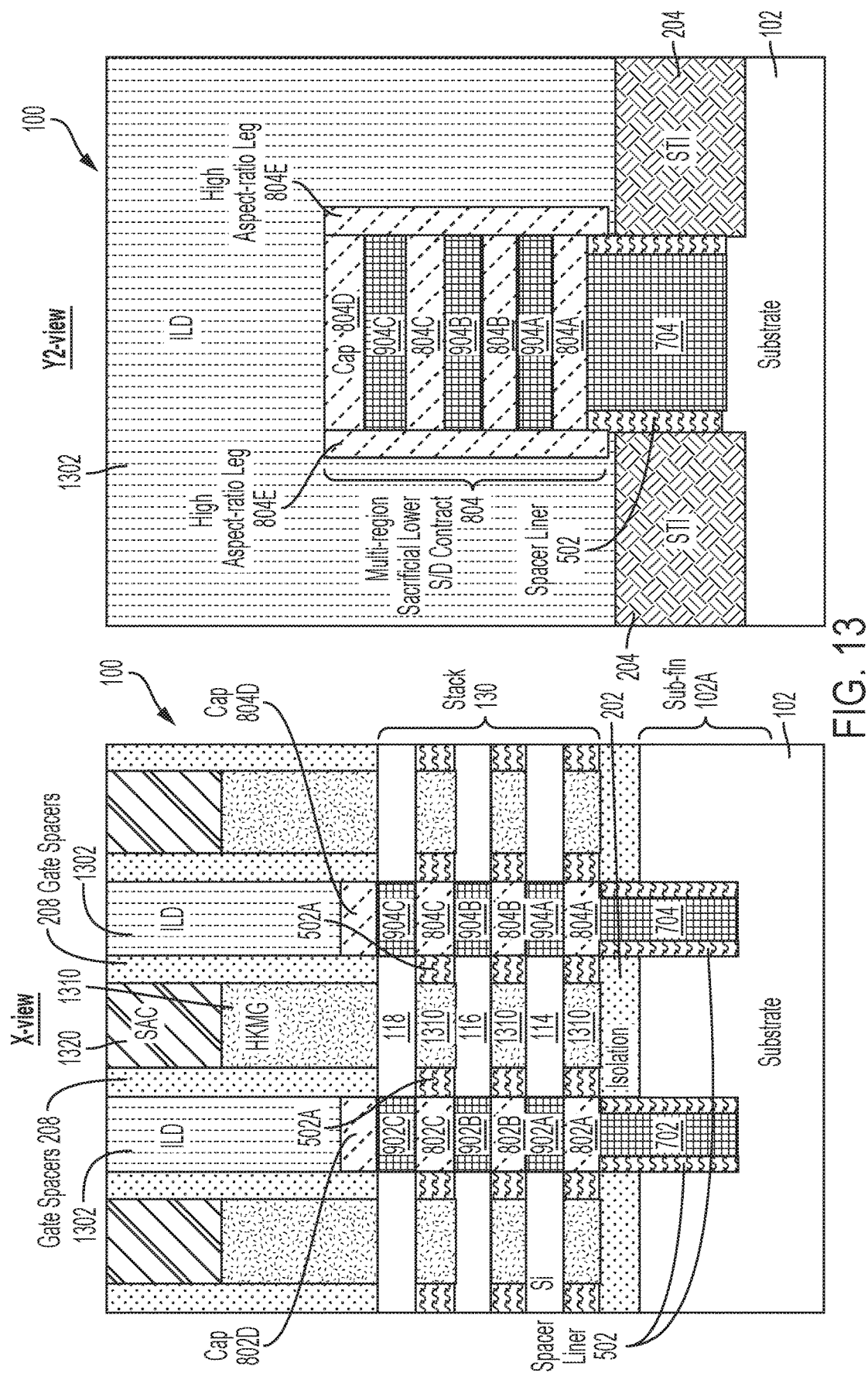

In FIG. 13, known semiconductor device fabrication processes have been used to deposit an interlayer dielectric (ILD) 1302 to fill in remaining open spaces of the nanosheet-based structure 100 (shown in FIG. 12) and stabilize the nanosheet-based structure 100. The structure 100 is planarized to a predetermined level that removes the hard masks 206, the protective liners 1102, and some portions of the gate spacers 208. In aspects of the invention, the deposited ILD regions 1302 can be formed from a low-k dielectric (e.g., k less than about 4) and/or an ultra-low-k (ULK) dielectric (e.g., k less than about 2.5).

Referring still to FIG. 13, a replacement metal gate (RMG) process has been applied to the nanosheet-based structure 100 to replace the sacrificial nanosheets 122, 124, 126 and the dummy gates 204 with high-k metal gate (HKMG) stack structures 1310. The dummy gates 204 and the gate dielectric (not shown) can be removed by suitable known etching processes, e.g., RIE or wet removal processes. Known semiconductor fabrication operations can be used to remove the SiGe sacrificial nanosheets 122, 124, 126 selective to the Si non-sacrificial nanosheets 114, 116, 118. In embodiments of the invention, because the sacrificial nanosheets 122, 124, 126 are formed from SiGe, they can be selectively etched with respect to the Si nanosheets 114, 116, 118 using, for example, a vapor phase hydrogen chloride (HCL) gas isotropic etch process.

The HKMG stack structures 1310 can be formed using any suitable known fabrication operations. Each of the HKMG stack structure 1310 includes a dielectric layer and a metal gate structure. The HKMG stack structures 1310 each surround the non-sacrificial nanosheets 114, 116, 118 and regulate electron flow through the non-sacrificial nanosheets 114, 116, 118. The metal gate structure can include metal liners and work-function metals (WFM). In embodiments of the invention, the WFM can be, for example, TiN or TaN, and the metal gate structure can be aluminum or tungsten. The dielectric layer can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Referring still to FIG. 13, known fabrication processes have been used to selectively recess the HKMG stack structures 1310 and deposit (e.g., using ALD) a nitride fill material in the spaces between the gate spacers 208 that were occupied by the HKMG stack structures 1310, thereby forming self-aligned caps (SACs) 1320.

Figure 14:
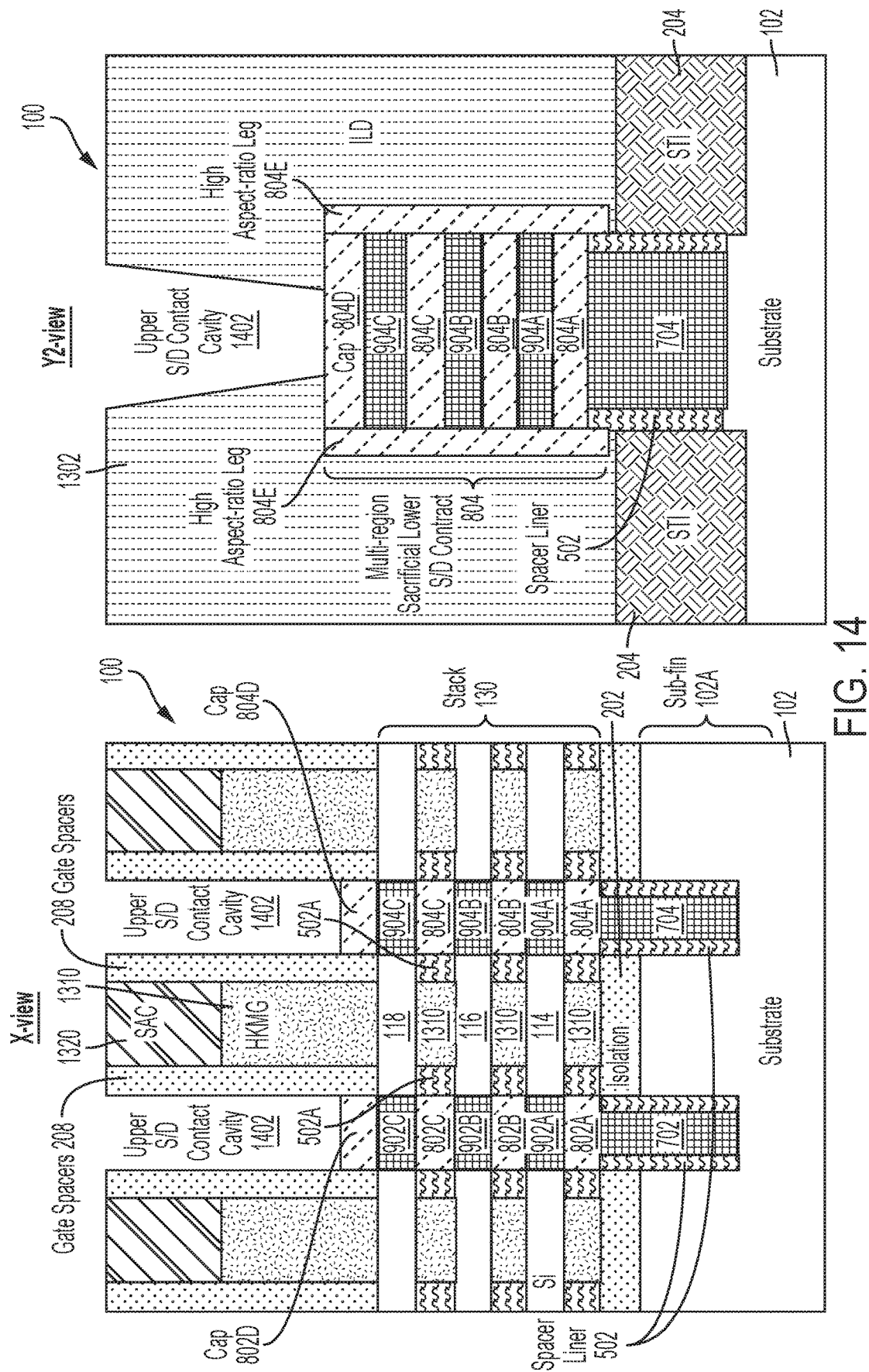

In FIG. 14, known semiconductor fabrication processes have been used to pattern and etch the ILD 1302 to form upper S/D cavities 1402 that expose portions of the top surfaces of the sacrificial S/D contact capping layers 802D, 804D.

In FIG. 15, known semiconductor fabrication processes have been used to remove the multi-region sacrificial lower S/D contacts 804 (shown in FIG. 14), thereby forming a set of multi-region bottom S/D contact cavities 1502. In embodiments of the invention, the multi-region sacrificial lower S/D contacts 804 can be removed by applying a selective etch (e.g., a hydrochloric acid (HCl)) configured to selectively etch SiGe (or SiGe 85%). At this fabrication stage, a set of S/D contact trenches has been formed, wherein each S/D contact trench is formed from the upper S/D contact cavity 1402 communicatively coupled to the set of multi-region bottom contact cavities 1502.

Figure 16:
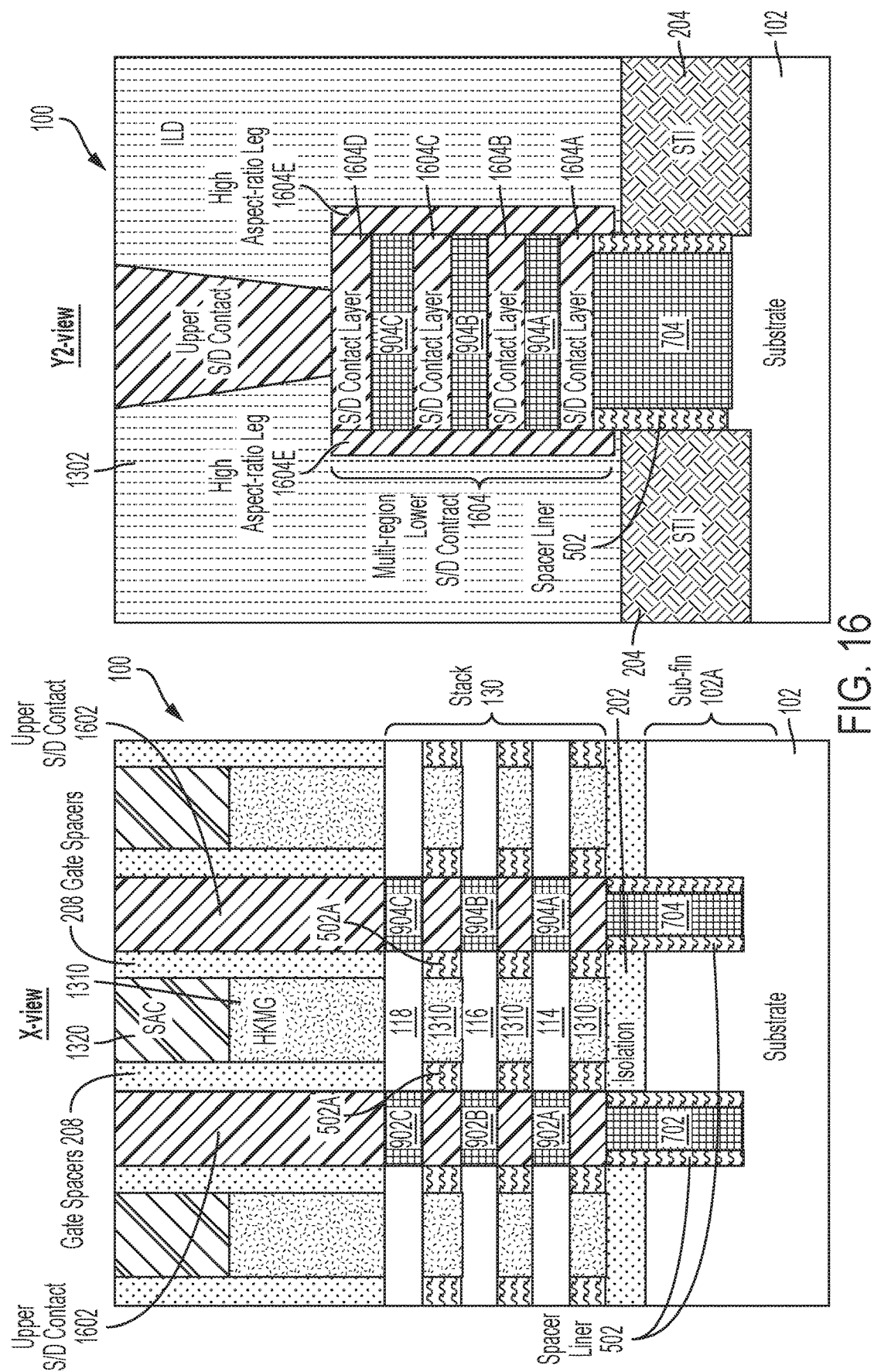

In FIG. 16, known semiconductor fabrication processes have been used to form in the upper S/D contact cavities 1402 (shown in FIG. 15) and the set of multi-region bottom contact cavities 1502 (shown in FIG. 15) upper S/D contacts 1602 communicatively coupled to multi-region lower S/D contacts 1604. In accordance with aspects of the invention, the multi-region lower S/D contacts 1604 each include S/D contact layers 1604A, 1604B, 1604C, 1604D and high aspect-ratio S/D contact legs 1604E, configured and arranged as shown such that the S/D contact layers 1604A, 1604B, 1604C, 1604D and the high aspect-ratio S/D contact legs 1604E wrap around the exposed surfaces of the spaced-apart and stacked doped S/D layers 902A, 902B, 902C, 904A, 904B, 904C. More specifically, in embodiments of the invention, the multi-region lower S/D contacts 1604 are on top surfaces, sidewalls, and bottom surfaces of the spaced-apart, stacked and doped S/D layers 902A, 902B, 902C, 904A, 904B, 904C.

In accordance with embodiments of the invention, the conductive material that forms the upper S/D contacts 1602 and the multi-region lower S/D contacts 1604 is provided as a stack of materials configured and arranged to include contact liners (not shown separately), contact barrier layers (not shown separately), and S/D contact metal. In embodiments of the invention, the contact liners are configured to assist in minimizing contact resistance. In embodiments of the invention, the contact liners (e.g., Ti) are conformally and selectively deposited on the spaced-apart, stacked and doped S/D layers 902A, 902B, 902C, 904A, 904B, 904C to form silicide regions. Example materials for forming the contact liners include, Ni, Pt, NiPt, and Ti. Example materials for forming the contact liners can further include tantalum nitride and tantalum (TaN/Ta); titanium; titanium nitride; cobalt; ruthenium; and manganese. The contact barrier layers can be titanium nitride (TiN), tantalum nitride (TaN), hafnium nitride (HfN), niobium nitride (NbN), tungsten nitride (WN), or combinations thereof, where the contact barrier layers can prevent diffusion and/or alloying of the S/D contact metal with the spaced-apart, stacked and doped S/D layers 902A, 902B, 902C, 904A, 904B, 904C. In various embodiments of the invention, the contact barrier layers and/or the contact liners can be conformally deposited in the upper S/D contact cavities 1402 (shown in FIG. 15) and the set of multi-region bottom contact cavities 1502 (shown in FIG. 15) by ALD, CVD, MOCVD, PECVD, or combinations thereof. The S/D contact metal can be tungsten (W), aluminum (Al), copper (Cu), cobalt (Co), and/or ruthenium (Ru). The S/D contact metal can also be formed from any of the conductive materials previously described herein as suitable conductive materials for the HKMG 1310. In embodiments of the invention, the S/D contact metal can be formed conformally by ALD, CVD, and/or PVD. By using a conformal process to deposit the S/D contact metal, a uniform thickness of material is across all exposed surfaces regardless of whether the surface is facing upward or facing downward. By controlling the sequence of the conformal depositions of the liner, the barrier, and the S/D contact metal, the appropriate positioning of the liner, the barrier and the S/D contact metal in the upper S/D contact cavities 1402 (shown in FIG. 15) and the set of multi-region bottom contact cavities 1502 (shown in FIG. 15) is ensured. As noted above, the conformal liner (e.g., Ti) needed for silicide formation can be selectively deposited on the spaced-apart, stacked, and doped S/D layers 902A, 902B, 902C, 904A, 904B, 904C. Known gate contact fabrication methods can be used to form gate contacts for the HKMG stacks 1310.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings.

Alternative embodiments can be devised without departing from the scope of this invention. Although various connections and positional relationships (e.g., over, below, adjacent to, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

References in the specification to terms such as "vertical", "horizontal", "lateral," etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication operations to form a transistor, wherein the fabrication operations include:
    forming a source or drain (S/D) region comprising stacked, spaced-apart, and doped S/D layers; and
    forming a multi-region S/D contact structure configured to contact a top surface, a bottom surface, and sidewalls of each of the stacked, spaced-apart, and doped S/D layers;
    wherein the multi-region S/D contact structure comprises stacked and spaced-apart S/D contact layers.

2. The method of claim 1, wherein:
    forming the multi-region S/D contact structure comprises forming a sacrificial multi-region S/D contact structure; and
    replacing the sacrificial multi-region S/D contact structure with the multi-region S/D contact structure.

3. The method of claim 1, wherein the fabrication operations further include forming an S/D contact structure comprising an upper S/D contact structure communicatively coupled to the multi-region S/D contact structure.

4. The method of claim 1, wherein the stacked, spaced-apart, and doped S/D layers and the stacked and spaced-apart S/D contact layers form a stack.

5. The method of claim 4, wherein the multi-region S/D contact structure further comprises a high aspect-ratio leg region.

6. The method of claim 5, wherein the high aspect-ratio leg region is communicatively coupled to sidewall surfaces of the stacked and spaced-apart S/D contact layers.

7. The method of claim 6, wherein the high aspect-ratio leg region is communicatively coupled to sidewall surfaces of the stacked, spaced-apart, and doped S/D layers.

8. The method of claim 4, wherein:
    forming the multi-region S/D contact structure comprises forming the stack; and
    forming the stack comprises forming a formation assistance region in a substrate of the transistor.

9. The method of claim 8, wherein forming the stack further comprises:
    epitaxially growing an initial portion of a sacrificial multi-region S/D contact structure from the formation assistance region;
    epitaxially growing an initial portion of the multi-region S/D contact structure from the initial portion of the sacrificial multi-region S/D contact structure;
    epitaxially growing subsequent portions of the sacrificial multi-region S/D contact; and
    epitaxially growing subsequent portions of the multi-region S/D contact structure.

10. The method of claim 9, wherein forming the stack further comprises replacing the sacrificial multi-region S/D contact structure with the multi-region S/D contact structure.

11. The method of claim 10, wherein the formation assistance region is configured to provide electrical isolation of the stack from the substrate.

12. The method of claim 11, wherein forming the formation assistance region comprises doping the formation assistance region such that the formation assistance region provides electrical isolation of the stack from the substrate.

13. A transistor device comprising:
    a source or drain (S/D) region comprising stacked, spaced-apart, and doped S/D layers; and
    a multi-region S/D contact structure configured to contact a top surface, a bottom surface, and sidewalls of each of the stacked, spaced-apart, and doped S/D layers;

wherein the multi-region S/D contact structure comprises stacked and spaced-apart S/D contact layers.

14. The device of claim 13, wherein the S/D contact structure comprises an upper S/D contact structure communicatively coupled to the multi-region S/D contact structure.

15. The device of claim 13, wherein the stacked, spaced-apart, and doped S/D layers and the stacked and spaced-apart S/D contact layers form a stack.

16. The device of claim 15, wherein the multi-region S/D contact structure further comprises a high aspect-ratio leg region.

17. The device of claim 16, wherein the high aspect-ratio leg region is communicatively coupled to sidewall surfaces of the stacked and spaced-apart S/D contact layers.

18. The device 16 further comprising a formation assistance region in a substrate of the transistor, wherein the formation assistance region is configured to provide electrical isolation of the stack from the substrate.

19. The device of claim 17, wherein the high aspect-ratio leg region is communicatively coupled to sidewall surfaces of the stacked, spaced-apart, and doped S/D layers.

* * * * *